United States Patent
Han et al.

(10) Patent No.: US 9,558,816 B2
(45) Date of Patent: Jan. 31, 2017

(54) METHOD FOR REGULATING READING VOLTAGE OF NAND FLASH MEMORY DEVICE

(71) Applicant: The-AiO Inc., Gyeonggi-do (KR)

(72) Inventors: Seung-Hyun Han, Seoul (KR);
Sun-Mo Hwang, Gyeonggi-do (KR)

(73) Assignee: The-AiO Inc., Gyeonggi-do (KR)

( * ) Notice: Subject to any disclaimer, the term of this patent is extended or adjusted under 35 U.S.C. 154(b) by 0 days.

(21) Appl. No.: 15/021,210

(22) PCT Filed: Jun. 27, 2014

(86) PCT No.: PCT/KR2014/005727
§ 371 (c)(1),
(2) Date: Mar. 10, 2016

(87) PCT Pub. No.: WO2015/037817
PCT Pub. Date: Mar. 19, 2015

(65) Prior Publication Data
US 2016/0225440 A1 Aug. 4, 2016

(30) Foreign Application Priority Data

Sep. 12, 2013 (KR) ........................ 10-2013-0109848

(51) Int. Cl.
*G11C 16/34* (2006.01)
*G11C 11/56* (2006.01)
*G11C 16/26* (2006.01)

(52) U.S. Cl.
CPC ........... *G11C 11/5642* (2013.01); *G11C 16/26* (2013.01); *G11C 16/3404* (2013.01)

(58) Field of Classification Search
CPC . G11C 11/5642; G11C 16/0458; G11C 16/26; G11C 16/34; G11C 16/3404; G11C 11/56

USPC ......................................... 365/185.03, 185.24
See application file for complete search history.

(56) References Cited

U.S. PATENT DOCUMENTS

| 8,243,514 B2* | 8/2012 | Kang | G11C 11/5642 365/185.03 |
| 2012/0008414 A1* | 1/2012 | Katz | G11C 16/26 365/185.24 |
| 2014/0056066 A1* | 2/2014 | Baum | G11C 7/065 365/185.03 |

FOREIGN PATENT DOCUMENTS

| KR | 10-2009-0000463 A | 1/2009 |
| KR | 10-2011-0116473 A | 10/2011 |
| KR | 10-2013-0030099 A | 3/2013 |
| KR | 10-2013-0049543 A | 5/2013 |
| KR | 10-2013-0087092 A | 8/2013 |

* cited by examiner

*Primary Examiner* — Tan T. Nguyen
(74) *Attorney, Agent, or Firm* — Blank Rome LLP

(57) ABSTRACT

A method of adjusting read voltages for a NAND flash memory device includes an operation of reading first page data from a first page corresponding to a paired page of a second page, an operation of simultaneously changing the first test read voltage and the third test read voltage to read second page data from a second page, an operation of performing a bitwise operation on the first page data and the second page data an operation of counting a number of memory cells corresponding to a first threshold voltage state and a fourth threshold voltage state by using a result of the bitwise operation, and an operation of setting a first read voltage and a third read voltage as a voltage corresponding to a section in which a change in the number of memory cells is a lowest value.

8 Claims, 9 Drawing Sheets

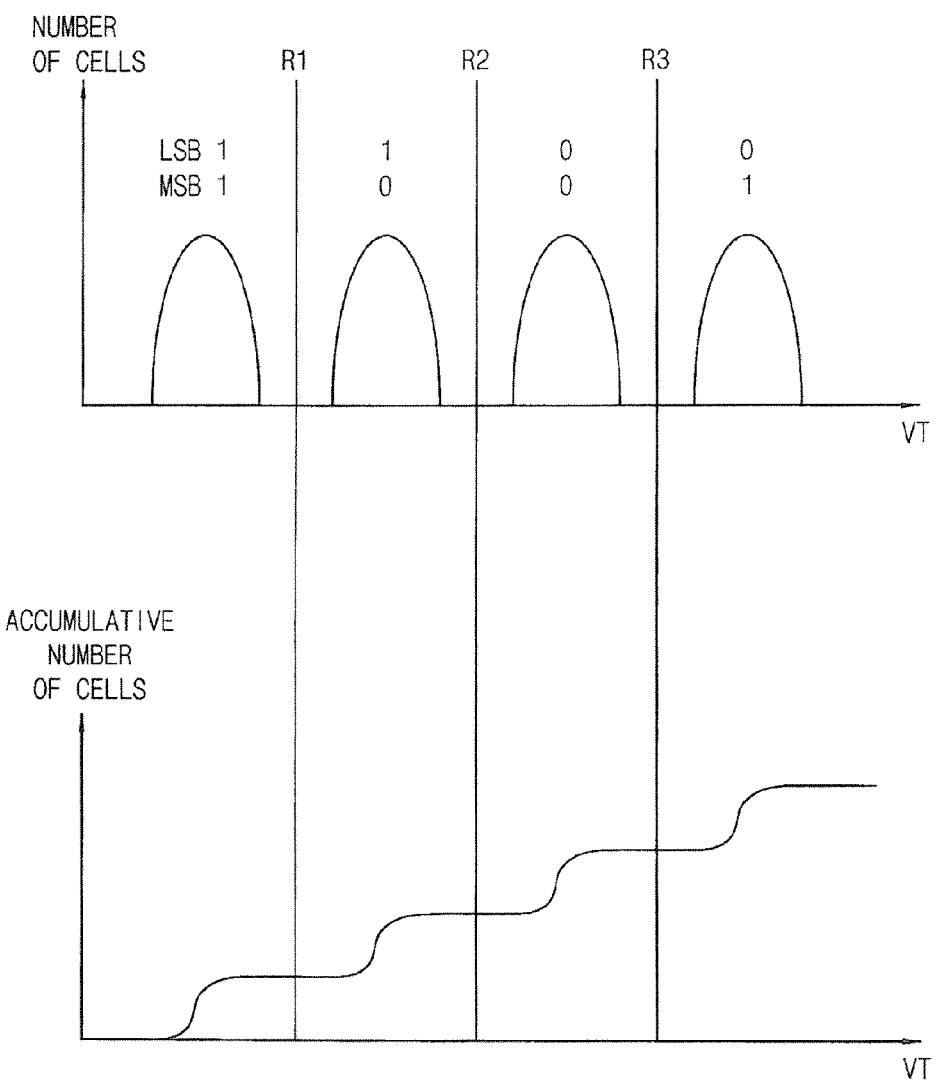

METHOD FOR REGULATING READING VOLTAGE OF NAND FLASH MEMORY DEVICE

BACKGROUND

1. Technical Field

Example embodiments relate generally to a nonvolatile memory device. More particularly, embodiments of the present inventive concept relate to a method of adjusting read voltages for a NAND flash memory device.

2. Description of the Related Art

A NAND flash memory device can store data by injecting an electric charge into a floating gate and read the stored data at a time when requested. The NAND flash memory device includes a plurality of memory cells. Each memory cell stores one-bit data or multi-bit data. In the single-level cell (SLC) NAND flash memory device, each memory cell corresponds to one of two threshold voltage states to store one-bit data. In contrast, in the multi-level cell (MLC) NAND flash memory device, each memory cell corresponds to one of four threshold voltage states to store 2-bit data. Further, in the triple-level cell (TLC) NAND flash memory device, each memory cell corresponds to one of eight threshold voltage states to store 3-bit data.

Therefore, the MLC NAND flash memory device can store relatively large amounts of data because the memory cell of the MLC NAND flash memory device stores more data than the memory cell of the SEC NAND flash memory device. Generally, the MLC NAND flash memory device can reduce the chip size to about 35% and the manufacturing cost to about 40% in comparison with the SLC NAND flash memory device.

On the other hand, the MLC NAND flash memory device has a relatively low read/write/erase performance in comparison with the SLC NAND flash memory device because each memory cell of the MLC NAND flash memory device stores multi-bit data. Generally, a read speed of the MLC NAND flash memory device is about 30% lower than a read speed of the SLC NAND flash memory device, and a write speed of the MLC NAND flash memory device is about 75% lower than a write speed of the SLC NAND flash memory device. In addition, an erase speed of the MLC NAND flash memory device is only about $\frac{1}{10}$ of an erase speed of the SLC NAND flash memory device. Overall, the performance of the MLC NAND flash memory device is about 60% lower than the performance of the SLC NAND flash memory device. In spite of these disadvantages, the MLC NAND flash memory device is widely used because of the advantage of low cost.

Recently, in the NAND flash memory device each of which memory cell stores multi-bit data for storing relatively large amounts of data. methods of reducing the read error are developed to improve the reliability the of the read data. For example, because a threshold voltage distribution is gradually broadened due to charge loss and charge acquisition, the read error occurs by a variation of the threshold voltage distribution in the MLC NAND flash memory device. Therefore, it is necessary to adjust the read voltages according to the variation of the threshold voltage distribution.

SUMMARY

Some example embodiments provide a method of adjusting read voltages for a NAND flash memory device capable of searching and setting optimal read voltages.

According to an aspect of example embodiments, a method of adjusting read voltages for a NAND flash memory device may include an operation of reading first page data from a first page corresponding to a paired page of a second page, an operation of dividing a range of a first test read voltage and a range of a third test read voltage into a plurality of sections, an operation of simultaneously changing the first test read voltage and the third test read voltage to read second page data from a second page, an operation of performing a bitwise operation on the first page data and the second page data, an operation of counting a number of memory cells corresponding to a first threshold voltage state and a fourth threshold voltage state by using a result of the bitwise operation, and an operation of setting a first read voltage as a voltage corresponding to a section in which a change in the number of memory cells corresponding to the first threshold voltage state is a lowest value in the range of the first test read voltage, and setting a third read voltage as a voltage corresponding to a section in which a change in the number of memory cells corresponding to the fourth threshold voltage state is a lowest value in the range of the third test read voltage.

In example embodiments, each of the memory cells may be a multi-level cell (MLC).

In example embodiments, the first page may be a least significant bit (LSB) page. The second page may be a most significant bit (MSB) page.

In example embodiments, the change in the number of memory cells may be calculated based on a 1 bit count of the result of the bitwise operation.

In example embodiments, the bitwise operation may be performed according to [Logic Equation 1] below:

$$THV1 = PD1 \text{ AND } PD2, \quad \text{[Logic Equation 1]}$$

wherein THV1 is a value of the first threshold voltage state. PD1 is the first page data, and PD2 is the second page data.

In example embodiments, the bitwise operation may be performed according to [Logic Equation 2] below:

$$THV4 = (PD1 \text{ XOR } PD2) \text{ AND } PD2, \quad \text{[Logic Equation 2]}$$

wherein THV4 is a value of the fourth threshold voltage state, PD1 is the first page data, and PD2 is the second page data.

In example embodiments, the first read voltage or the third read voltage may be set as a median value of the section in which the change in the number of memory cells is a lowest value.

In example embodiments, the section in which the change in the number of memory cells corresponding to the first threshold voltage state or the fourth threshold voltage state may be a lowest value is searched using a binary search manner.

Therefore, a method of adjusting read voltages for a NAND flash memory device according to example embodiments simultaneously counts the number of memory cells corresponding to a first threshold voltage state and a fourth threshold voltage state by one read operation for a most significant bit (MSB) page and simultaneously changes first and third read voltages. Accordingly, the method of adjusting read voltages for the NAND flash memory device can improve the read performance of the NAND flash memory device.

BRIEF DESCRIPTION OF THE DRAWINGS

Illustrative, non-limiting example embodiments will be more clearly understood from the following detailed description taken in conjunction with the accompanying drawings.

FIG. 1A is a diagram illustrating an example of a threshold voltage distribution of a memory cell in a MLC NAND flash memory device.

DETAILED DESCRIPTION OF THE EMBODIMENTS

Hereinafter, embodiments of the present inventive concept will be explained in detail with reference to the accompanying drawings. For convenience of description, it is assumed that a NAND flash memory device is a MLC NAND flash memory device, and LSB and MSB page data are programmed to "11", "10", "00", and "01" in increasing order of a threshold voltage of the memory cell.

Figure 1B:
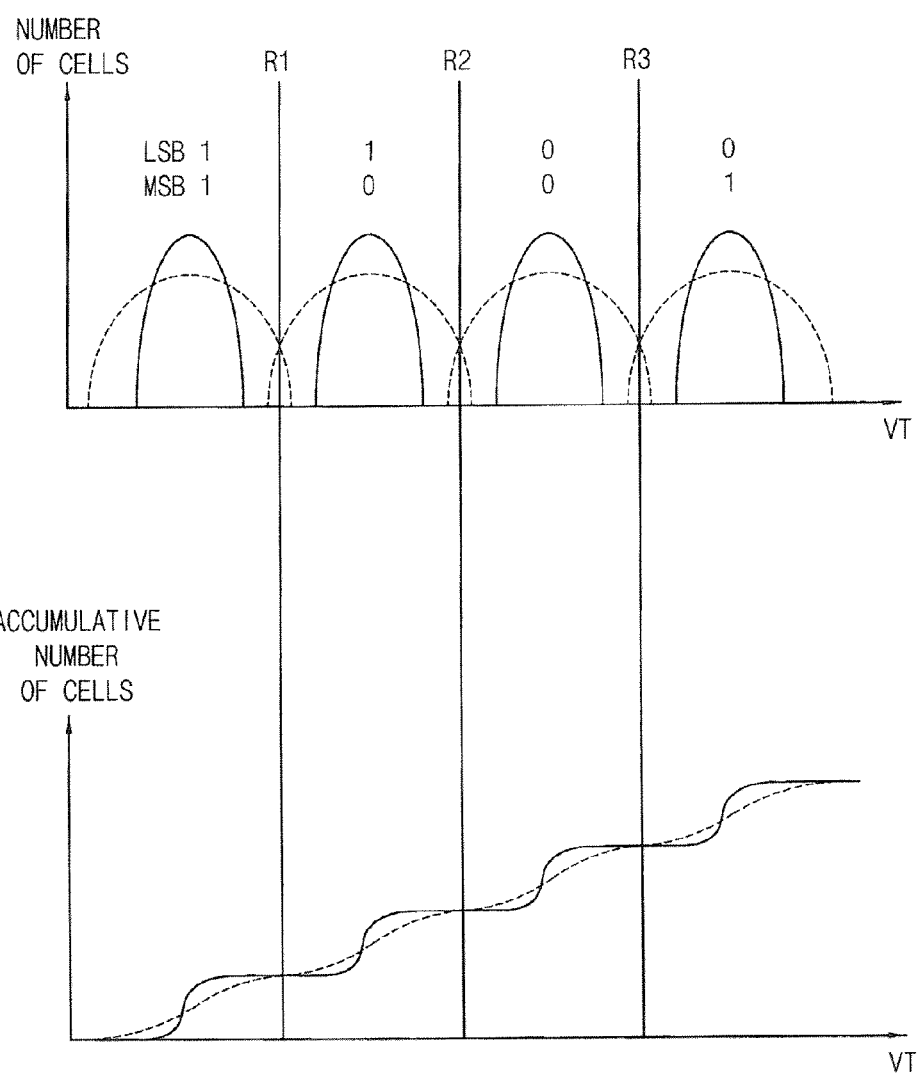
FIG. 1B is a diagram illustrating an example of an altered threshold voltage distribution of a memory cell in a MLC NAND flash memory device.

FIG. 1A is a diagram illustrating an example of a threshold voltage distribution of a memory cell in a MLC NAND flash memory device. FIG. 1B is a diagram illustrating an example of an altered threshold voltage distribution of a memory cell in a MLC NAND flash memory device.

Referring to FIG. 1A, each memory cell of the MLC NAND flash memory device may store 2-bit data including a lower-order bit and a higher-order bit. Here, the lower-order bit of MLC refers a least significant bit (LSB), and the higher-order bit of MLC refers a most significant bit (MSB). The memory cell of the MLC NAND flash memory device may indicate one of four states including a first threshold voltage state, a second threshold voltage state, a third threshold voltage state, and a fourth threshold voltage state in increasing order of a magnitude of a threshold voltage. Each threshold voltage state may correspond to certain value to be programmed. For example, the memory cell of the MLC NAND flash memory device may indicate one of "11", "10", "00", and "01" according to a magnitude of the threshold voltage. The (N)th read voltage Rn is for reading a value according to the magnitude of the threshold voltage. In the MLC NAND flash memory device, the first read voltage R1, the second read voltage R2, and the third read voltage R3 may bet set in increasing order of the magnitude of the threshold voltage to distinguish the four threshold voltage states.

Referring to FIG. 1B, a threshold voltage distribution of the memory cell may be gradually broadened due to charge loss and charge acquisition in the MLC NAND flash memory device. Thus, when the write and erase operations are repeatedly performed, the threshold voltage distribution may be altered according to a change in a resistance of oxide layer, and then the read error may occur due to the broadened threshold voltage distribution. It is necessary to adjust the read voltages in order to reduce the read error because the read error can be corrected based on ECC error detection data when the read error is slight. The read voltage can be set as a voltage at which the number of memory cells corresponding to the voltage is the minimum. In other words, the read voltage can be set as a voltage at which a change in the accumulative number of cells is the minimum. In FIG. 1B, each of the first read voltage R1, the second read voltage R2, and the third read voltage R3 may be set as a voltage at which a change in the accumulative number of cells is the minimum (thus, a voltage corresponding to a section having the lowest slope in a graph showing a relationship between the accumulative number of memory cells and the threshold voltage).

Figure 2A:
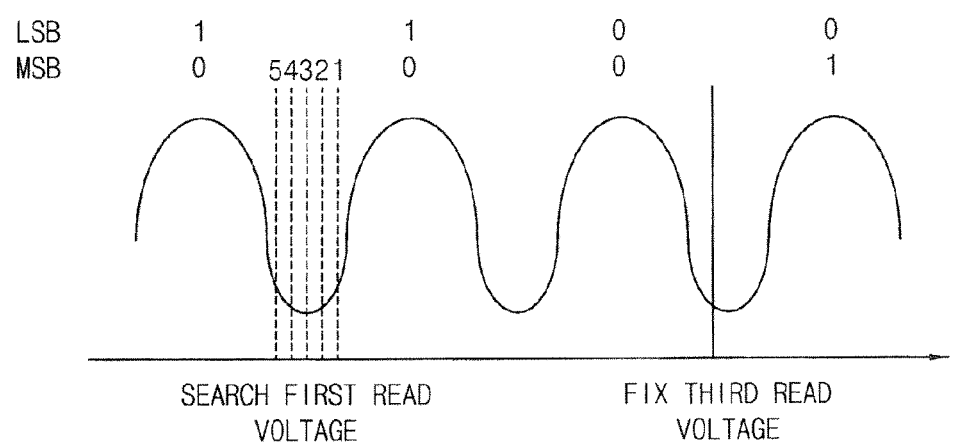
FIG. 2A is a diagram illustrating an example in which a first read voltage is adjusted in a conventional MLC NAND flash memory device.
Figure 2B:
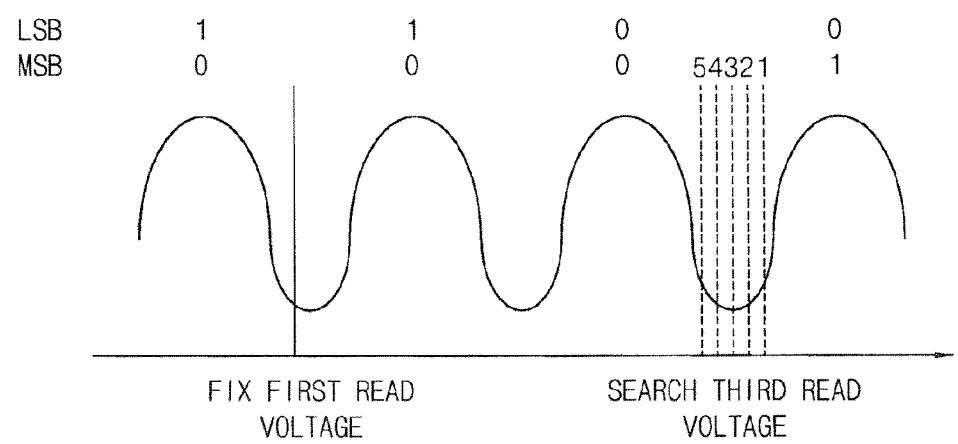
FIG. 2B is a diagram illustrating an example in which a third read voltage is adjusted in a conventional MLC NAND flash memory device.

FIG. 2A is a diagram illustrating an example in which a first read voltage is adjusted in a conventional MLC NAND flash memory device. FIG. 2B is a diagram illustrating an example in which a third read voltage is adjusted in a conventional MLC NAND flash memory device.

Referring to FIGS. 2A and 2B, when the read operation for LSB page is performed. the second read voltage may be independently adjusted because the LSB page data are separated by only the second read voltage. On the other hand, when the read operation for MSB page is performed. the MSB page data can be determined by the first read voltage and the third read voltage. When the first read voltage is adjusted in a conventional NAND flash memory device, the third read voltage is fixed in order to avoid being affected by the change of the third read voltage. Likewise, when the third read voltage is adjusted in the conventional NAND flash memory device, the first read voltage is fixed in order to avoid being affected by the change of the first read voltage. Therefore, when the read operation for MSB page is performed, there is a problem that the read operation is repeatedly performed two times because it is need to adjust the first read voltage and the third read voltage, respectively.

Figure 3:
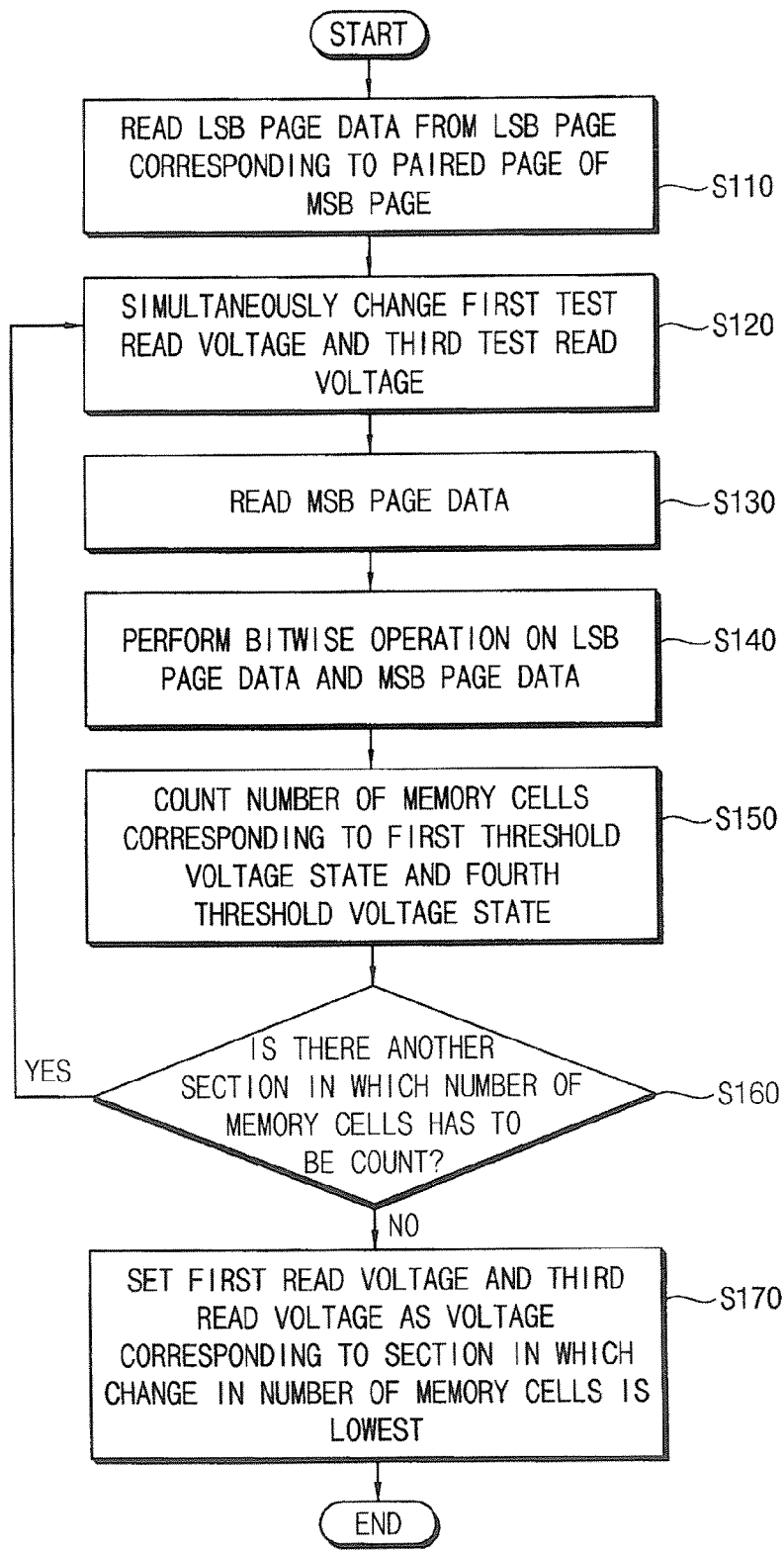
FIG. 3 is a flowchart illustrating a method of adjusting read voltages for a NAND flash memory device according to example embodiments.

FIG. 3 is a flowchart illustrating a method of adjusting read voltages for a NAND flash memory device according to example embodiments.

Referring to FIG. 3, the above problem that the read operation for the MSB page is repeatedly performed two times can be solved by simultaneously adjusting the first read voltage and the third read voltage when the read error of the MSB page data occurs. A method of adjusting read voltages of FIG. 3 may read LSB page data from a LSB page corresponding to a paired page of a MSB page (S110) and may simultaneously change the first test read voltage and the third test read voltage (S120). And then the method of adjusting read voltages of FIG. 3 may read MSB page data using the first test read data and the third test read data (S130). The method of adjusting read voltages of FIG. 3 may perform a bitwise operation on the LSB page data and the MSB page data (S140) and may count the number of memory cells corresponding to a first threshold voltage state and the number of memory cells corresponding to a fourth threshold voltage state by using the result of the bitwise operation (S150). The method of adjusting read voltages of FIG. 3 may repeatedly perform the operations of counting the number of the memory cells according to the test read voltages (S120 through S150), may calculate a change in the number of memory cells corresponding to a first threshold voltage state and a fourth threshold voltage state, and may set a first read voltage and a third read voltage corresponding to a section in which a change of the number of memory cells is the lowest (S170). Here, a pair of paired page can include multi-bit data stored in memory cells. The (N)th test read voltage indicates a read voltage that is used as temporary for adjusting the (N)th read voltage.

Specifically, the method of adjusting read voltages of FIG. 3 may read the LSB page data from a LSB page corresponding to a paired page of a MSB page to adjust the first read voltage and the third read voltage that are used for reading the MSB page data (S110). The method of adjusting read voltages of FIG. 3 may divide a range of a first test read voltage and a range of a third test read voltage into a plurality of sections, respectively, and simultaneously change the first test read voltage and the third test read voltage (S120). The method of adjusting read voltages of FIG. 3 may read the MSB page data from the MSB page using the changed first test read voltage and the changed third test read voltage (S130). The method of adjusting read voltages of FIG. 3 may perform the bitwise operation on the MSB page data and the LSB page data (S140), and may count the number of the memory cells corresponding to the first threshold voltage state and the fourth threshold voltage state, respectively (S150). The method of adjusting read voltages of FIG. 3 may determine whether a section in which the number of the memory cells has to be counted exists (S160). When the section in which the number of the memory cells has to be counted exists, the first test read voltage and the third test read voltage are simultaneously changed into next values, and then above operations may be performed repeatedly to count the number of the memory cells corresponding to the first threshold voltage state and the fourth threshold voltage state in each section. Therefore, the method of adjusting read voltages of FIG. 3 may derive the number of the memory cells and the change of the number of memory cells corresponding to the first threshold voltage state and the fourth threshold voltage state in each section by performing the bitwise operation on the LSB page data and the MSB page data although the first read voltage and the third read voltage are simultaneously changed. The method of adjusting read voltages of FIG. 3 may set the first read voltage as a voltage corresponding to a section in which a change in the number of memory cells corresponding to the first threshold voltage state is the lowest in the range of the first test read voltage and may set the third read voltage as a voltage corresponding to a section in which a change in the number of memory cells corresponding to the fourth threshold voltage state is the lowest in the range of the third test read voltage (S170), thereby setting read voltages for the NAND flash memory device as a voltage at which the read errors is minimized. In one example embodiment, the first read voltage or the third read voltage may be set as a median value of the section in which the change in the number of memory cells is the lowest.

Figure 4:
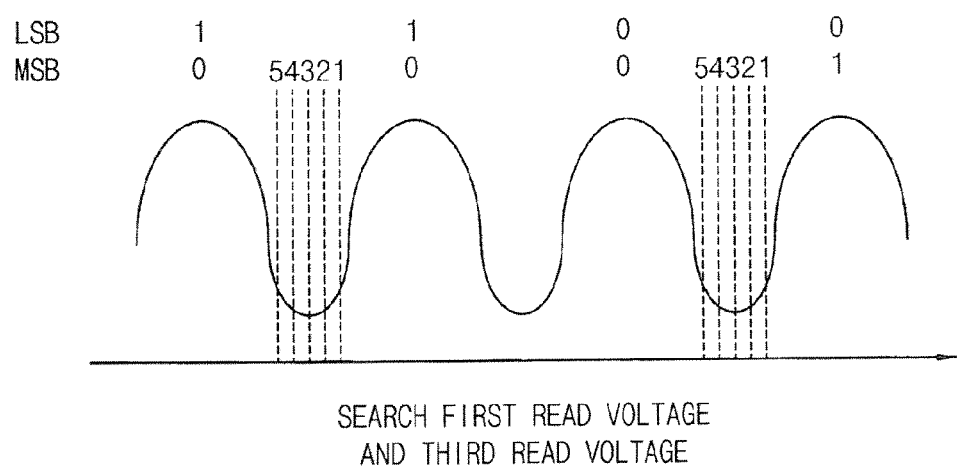
FIG. 4 is a diagram illustrating an example in which read voltages are adjusted in a method of adjusting read voltages for a NAND flash memory device of FIG. 3.

FIG. 4 is a diagram illustrating an example in which read voltages are adjusted in a method of adjusting read voltages for a NAND flash memory device of FIG. 3.

Referring to FIG. 4, a range of the first test read voltage and a range of the third test read voltage may be divided into a plurality of sections, respectively. The first test read voltage and the third test read voltage may be simultaneously changed to calculate a variation of the memory cells in each section. In one example embodiment, the first test read voltage and the third test read voltage may be sequentially changed from high voltage to low voltage in consideration of retention characteristics of the memory cells. However, it is possible that the first test read voltage and the third test read voltage may be sequentially changed from low voltage to high voltage.

In order to adjust the read voltages of the MLC NAND flash memory device, the first test read voltage may be changed to the highest read voltage in the range of the first test read voltage, and the third test read voltage may be changed to the highest read voltage in the range of the third test read voltage at the same time. The MSB page data may be read using the first test read voltage and the third test read voltage, and then the number of the memory cells may be counted by performing the bitwise operation on the LSB page data and the MSB page data. The first test read voltage and the third test read voltage may be changed to the next higher voltage, respectively. The number of the memory cells may be counted by reading the MSB page data and performing the bitwise operation on the LSB page data and the MSB page data. A change in the number of the memory cells corresponding to the first threshold voltage state and the fourth threshold voltage state may be calculated by comparing a result of the previous bitwise operation to a result of the current bitwise operation. The above operations are repeatedly performed until the first test read voltage and the third test read voltage reach to the lowest read voltage in the range of the first test read voltage and the third test read voltage. Accordingly, the section in which the change in the number of memory cells is the lowest can be searched.

Figure 5A:
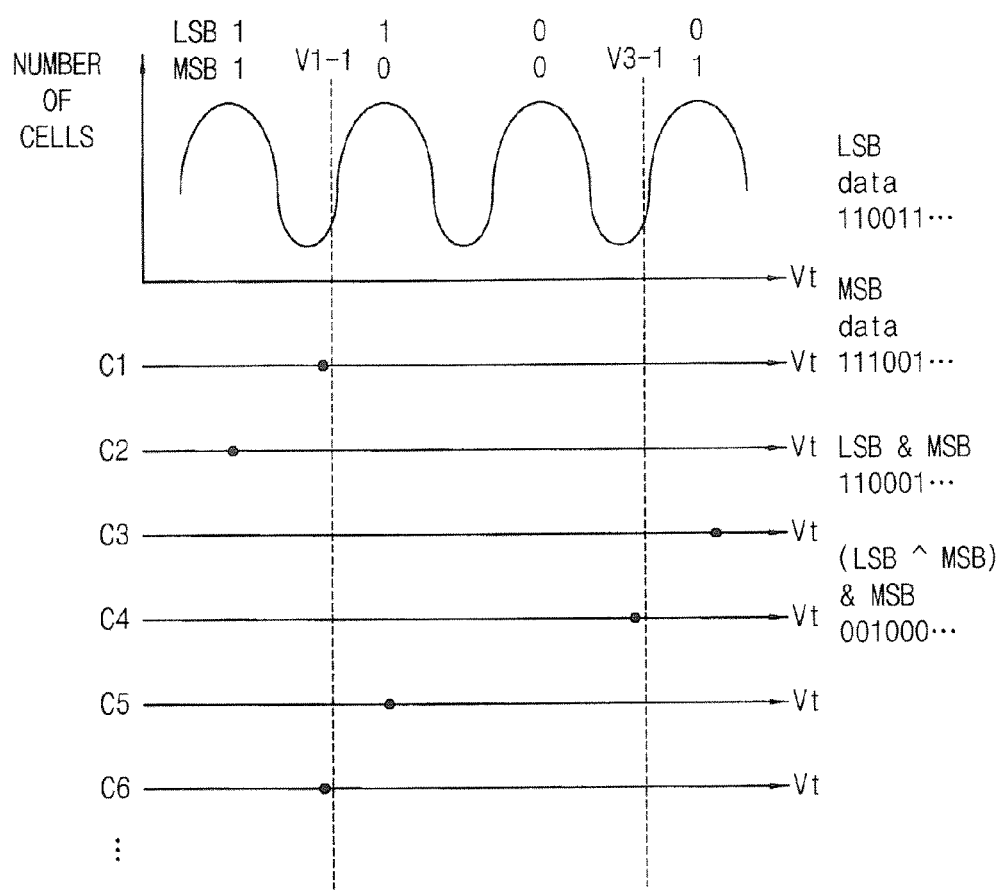
FIGS. 5A and 5B are diagrams illustrating an example in which a change of the number of memory cells according to a change of read voltages is calculated in a method of adjusting read voltages for a NAND flash memory device of FIG. 3.
Figure 5B:
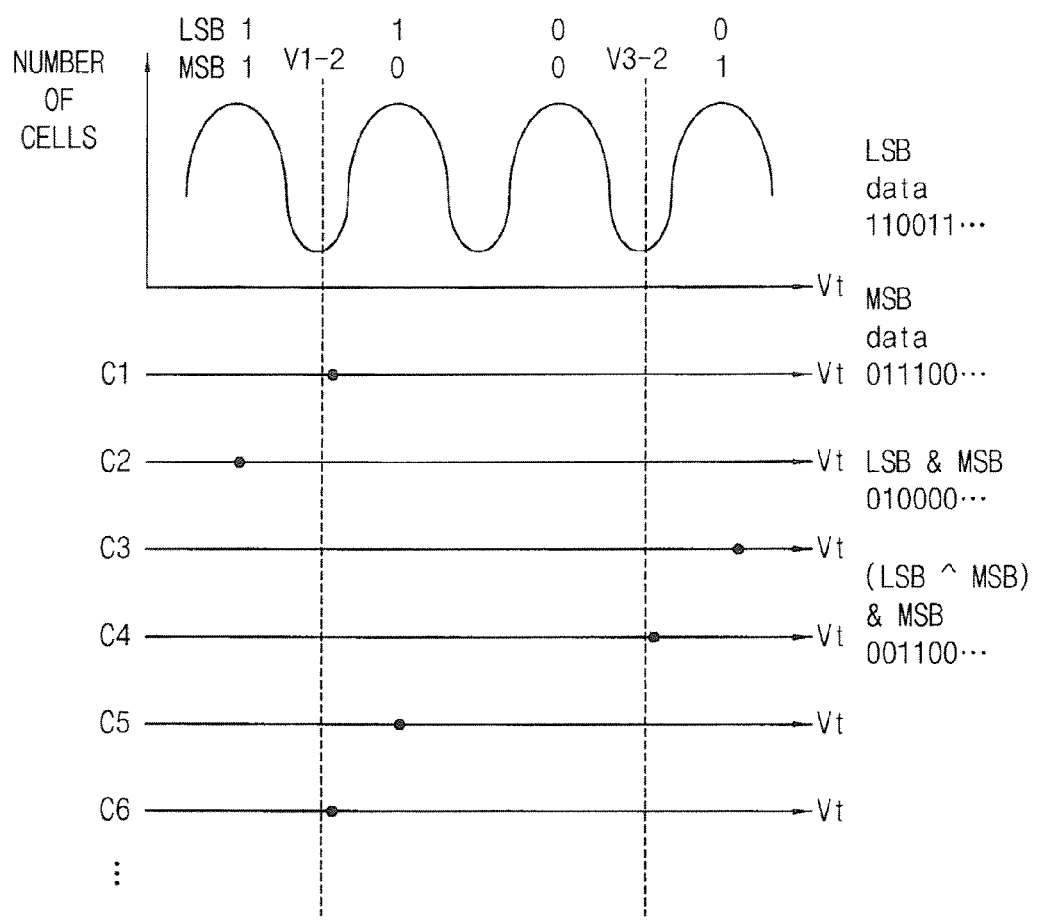

FIGS. 5A and 5B are diagrams illustrating an example in which a change of the number of memory cells according to a change of read voltages is calculated in a method of adjusting read voltages for a NAND flash memory device of FIG. 3.

Referring to FIG. 5A, a method of adjusting read voltages of FIG. 3 may read LSB page data (e.g., 110011 . . . ) and may change the first test read voltage to V1-1 and the third test read voltage to V3-1. MSB page data (e.g., 111001 . . . ) may be read using the first test read voltage (i.e., V1-1) and the third test read voltage (i.e., V3-1). A bitwise operation on the LSB page data and the MSB page data may be performed. In one example embodiment, the bitwise operation may correspond to [Logic Equation 1] and [Logic Equation 2].

$$THV1 = PD1 \text{ AND } PD2, \quad \text{[Logic Equation 1]}$$

wherein THV1 is a value of the first threshold voltage state, PD1 is the LSB page data, and PD2 is the MSB page data.

[Logic Equation 2]

$$THV4 = (PD1 \text{ XOR } PD2) \text{ AND } PD2,$$

wherein THV4 is a value of the fourth threshold voltage state, PD1 is the LSB page data, and PD2 is the MSB page data.

Therefore, the value of the first threshold voltage state may be calculated according to [Logic Equation 1], thus, '(110011 . . . ) AND (111001 . . . )=(110001 . . . )'. Memory cells (e.g., C1, C2, C6, . . . ) corresponding to the first threshold voltage state can be found based on the value of the first threshold voltage state. Likewise, the value of the fourth threshold voltage state may be calculated according to [Logic Equation 2], thus, '((110011 . . . ) XOR (111001 . . . )) AND (111001 . . . )=(001000 . . . )'. Memory cells (e.g., C3, . . . ) corresponding to the fourth threshold voltage state can be found based on the value of the fourth threshold voltage state.

Referring to FIG. 5B, the first test read voltage may be changed from V1-1 to V1-2 to count the number of memory cells belonging to a section between V1-1 and V1-2. The third test read voltage may be changed from V3-1 to V3-2 to count the number of memory cells belonging to a section between V3-1 and V3-2. The MSB page data (e.g., 011100 . . . ) may be read using the first test read voltage (i.e., V1-2) and the third test read voltage (i.e., V3-2). The value of the first threshold voltage state may be calculated according to [Logic Equation 1], thus, '(110011 . . . ) AND (011100 . . . )=(010000 . . . )'. Memory cells (e.g., C2, . . . ) corresponding to the first threshold voltage state can be found based on the value of the first threshold voltage state. Likewise, the value of the fourth threshold voltage state may be calculated according to [Logic Equation 2], thus, '((110011 . . . ) XOR (011100 . . . )) AND (011100 . . . )=(001100 . . . )'. Memory cells (e.g., C3, C4, . . . ) corresponding to the fourth threshold voltage state can be found based on the value of the fourth threshold voltage state.

The memory cells belonging to the section between V1-1 and V1-2 may be found such as (C1, C6, . . . ) because the value of the first threshold voltage state is changed from '(110001 . . . )' to '(010000 . . . )'. Also, the memory cells belonging to the section between V3-1 and V3-2 may be found such as (C4, . . . ) because the value of the fourth threshold voltage state is changed from '(001000 . . . )' to '(001100 . . . )'. Therefore, a variation of memory cells belonging to each section can be derived based on the value of the first threshold voltage state and the value of the fourth threshold voltage state that are calculated by the bitwise operation. In one example embodiment, the change in the number of the memory cells may be calculated based on a 1 bit count of the result of the bitwise operation. Considering preceding 6 memory cells in the above embodiment, 1 bit count of the value of the first threshold voltage state may be changed from 3 to 1. Accordingly, it can be calculated that the number of memory cells corresponding to the section between V1-1 and V1-2 (i.e., the changed in the number of the memory cells) is 2. Also, 1 bit count of the value of the fourth threshold voltage state may be changed from 1 to 2. Accordingly, it can be calculated that the number of memory cells corresponding to the section between V3-1 and V3-2 (i.e., the changed in the number of the memory cells) is 1. Therefore, the change in the number of memory cell corresponding to each section may be calculated based on a value of 1 bit count, thereby efficiently adjusting the read voltages for the NAND flash memory device.

Figure 6:
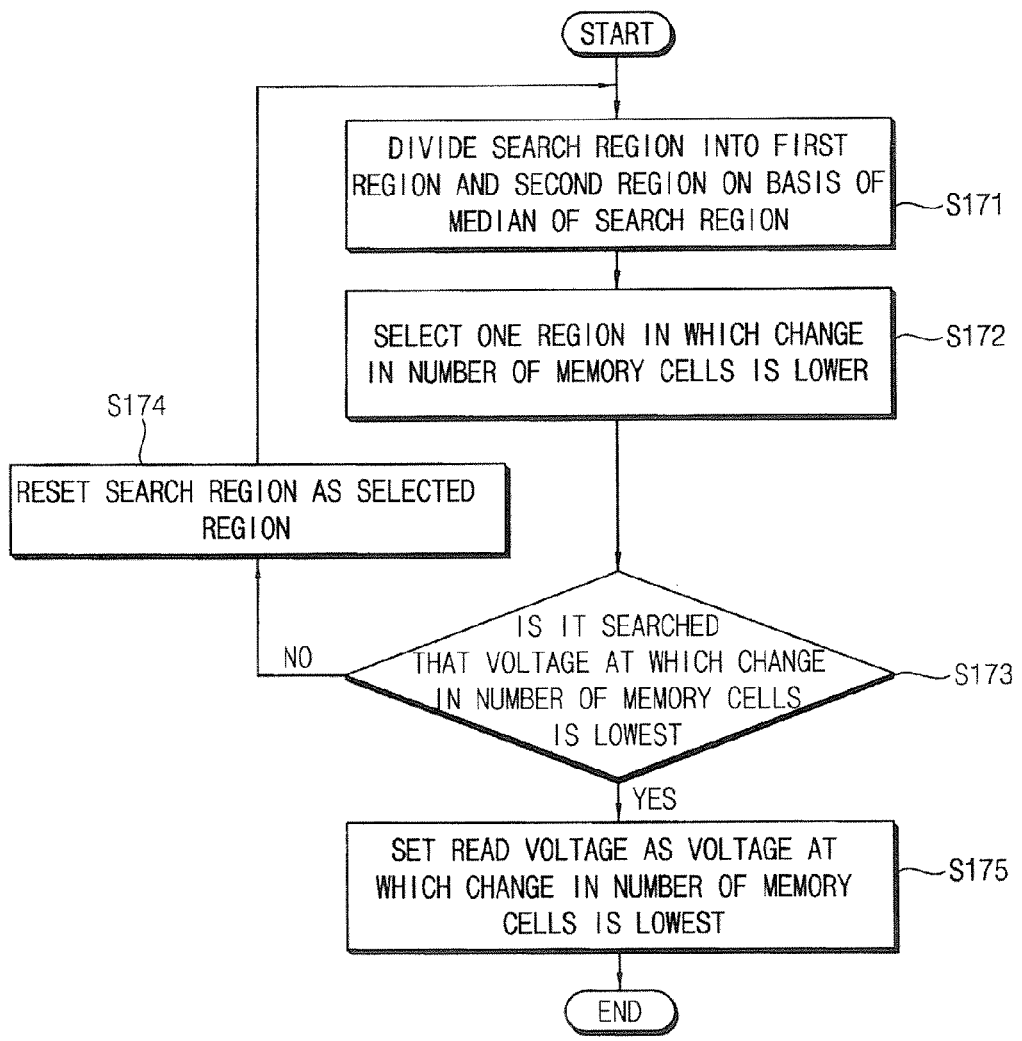
FIG. 6 is a flowchart illustrating a method of adjusting read voltages for a NAND flash memory device according to example embodiments.

FIG. 6 is a flowchart illustrating a method of adjusting read voltages for a NAND flash memory device according to example embodiments.

Referring to FIG. 6, a section in which the change in the number of memory cells corresponding to the first threshold voltage state or the fourth threshold voltage state is the lowest may be searched using a binary search manner.

Specifically, a range of the test read voltage may be divided into a plurality of sections having the same size, and a section in which a change in the number of memory cells is the lowest may be searched. Thereafter, the first read voltage and/or the third read voltage can be set in more detail using the binary search manner. Alternatively, a section in which the change in the number of memory cells is the lowest may be searched by the binary search manner for the overall range of the test read voltages. The method of adjusting read voltages of FIG. 6 may divide a search region into the first region and the second region (S171), may select one region in which the change in the number of memory cells is lower than another region (S172), may determine whether a voltage at which the change in the number of memory cells is the lowest is searched (S173). When the voltage at which the change in the number of memory cells is the lowest is not searched, the search region may be reset as the selected region (S174) and the above binary search operations may be repeatedly performed (S172 and S172). On the other hand, when the voltage at which the change in the number of memory cells is the lowest is searched, the first read voltage or the third read voltage may be set as the searched voltage (S175).

Therefore, the optimal read voltages are efficiently searched using the binary search manner in comparison with linear search manner or sequential search manner. Expressed in Big-O notation, the time complexity of the linear search manner is O(N) and the time complexity of the binary search manner is O(log N). Thus, the binary search manner more is more efficient in case that the search region is relatively large or the read voltage is minutely set.

Figure 7A:
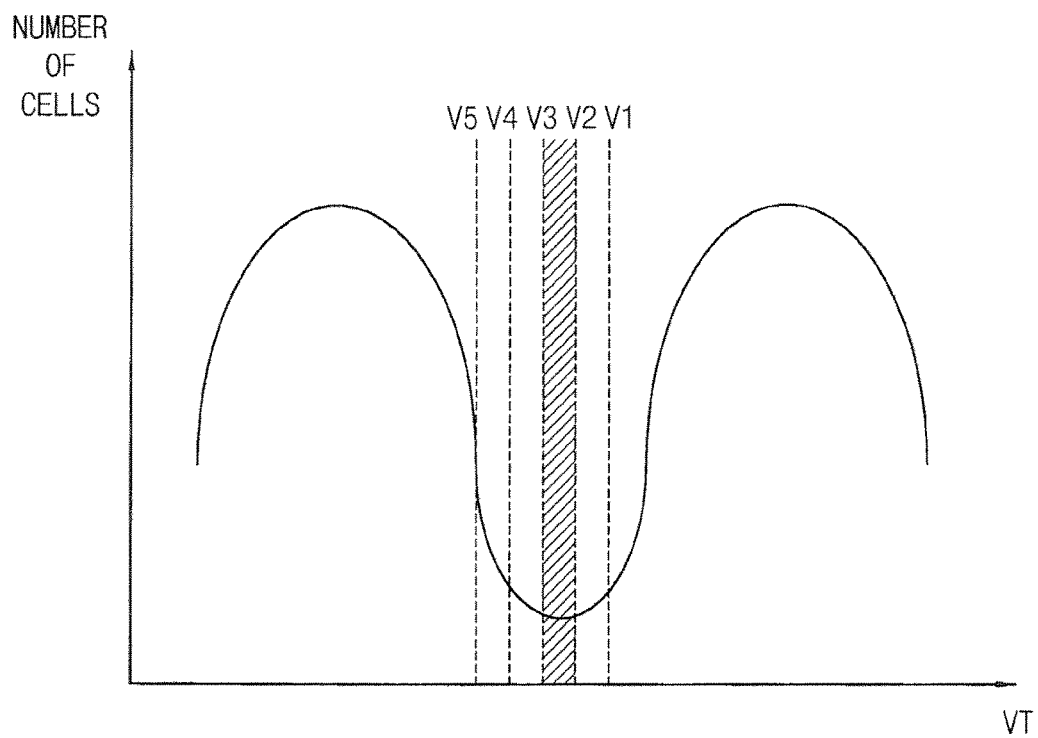
FIGS. 7A and 7B are diagrams illustrating an example in which read voltages are set using a binary search manner in a method of adjusting read voltages for a NAND flash memory device of FIG. 6.
Figure 7B:
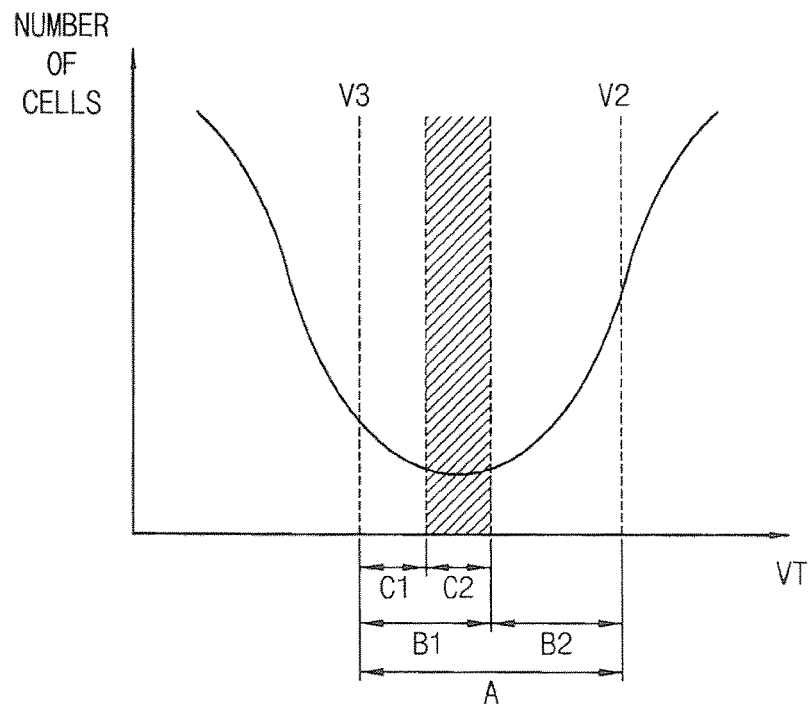

FIGS. 7A and 7B are diagrams illustrating an example in which read voltages are set using a binary search manner in a method of adjusting read voltages for a NAND flash memory device of FIG. 6.

Referring to FIG. 7A, a method of adjusting read voltages of FIG. 6 may divide a range of a test read voltage into a plurality of sections having the same size and may search a section (e.g., the section between V2 and V3) in which a change in the number of the memory cells is the lowest.

Referring to FIG. 7B, to seta first read voltage or a third read voltage in more detail, a search region A in which the change in the number of memory cells is the lowest may be divided into the first region B1 and the second region B2 on the basis of a median of the search region A. Because the change in the number of memory cells of the first region B1 is lower than the change in the number of memory cells of the second region B2, the first region B1 may be selected. The selected first region B1 is may be divided into the third region C1 and the fourth region C2 on the basis of a median of the first region B1. Because the change in the number of memory cells of the fourth region C2 is lower than the change in the number of memory cells of the third region C1, the first region C2 may be selected. The above operations may be repeatedly performed, and than the first read voltage or the third read voltage for minimizing read errors may be set. Although the example embodiment of FIGS. 7A and 7B divides the range of the test read voltage into the plurality of sections, searches the section in which the change in the number of memory cells is the lowest, and thereafter set the read voltages using the binary search manner for the searched section, the binary search manner can be used for the overall range of the test read voltages.

Although a method of adjusting read voltages for a NAND flash memory device according to example embodiments have been described with reference to figures, those skilled in the art will readily appreciate that many modifications are possible in the example embodiments without materially departing from the novel teachings and advantages of the present inventive concept. For example, although the example embodiments describe that the NAND flash memory device is the MLC NAND flash memory device, a kind of the NAND flash memory device is not limited thereto. Thus, the present inventive concept may be applied to the TLC NAND flash memory device. In addition, the example embodiments describe that the memory cell of the NAND flash memory device is programmed to "11", "10", "00", and "01" in increasing order of a voltage of the memory cell, the memory cell can be programmed in various ways according to the voltage of the memory cell.

The present inventive concept may be applied to a storage system including a NAND flash memory device. For example, the present inventive concept may be applied to a storage system including a solid state drive (SSD), a secure digital (SD) card, a universal flash storage (UFS), an embedded multi media card (EMMC), a compact flash (CF) card, a memory stick, a extreme digital picture card, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of adjusting read voltages for a NAND flash memory device, the method comprising:

reading first page data from a first page corresponding to a paired page of a second page;

dividing a range of a first test read voltage and a range of a third test read voltage into a plurality of sections;

simultaneously changing the first test read voltage and the third test read voltage to read second page data from a second page;

performing a bitwise operation on the first page data and the second page data;

counting a number of memory cells corresponding to a first threshold voltage state and a fourth threshold voltage state by using a result of the bitwise operation; and setting a first read voltage as a voltage corresponding to a section in which a change in the number of memory cells corresponding to the first threshold voltage state is a lowest value in the range of the first test read voltage, and setting a third read voltage as a voltage corresponding to a section in which a change in the number of memory cells corresponding to the fourth threshold voltage state is a lowest value in the range of the third test read voltage.

2. The method of claim 1, wherein each of the memory cells is a multi-level cell (MLC).

3. The method of claim 2, wherein the first page is a least significant bit (LSB) page, and wherein the second page is a most significant bit (MSB) page.

4. The method of claim 1, wherein the change in the number of memory cells is calculated based on a 1 bit count of the result of the bitwise operation.

5. The method of claim 1, wherein the bitwise operation is performed according to [Logic Equation 1] below:

$$THV1 = PD1 \text{ AND } PD2, \qquad \text{[Logic Equation 1]}$$

wherein THV1 is a value of the first threshold voltage state, PD1 is the first page data, and PD2 is the second page data.

6. The method of claim 1, wherein the bitwise operation is performed according to [Logic Equation 2] below:

$$THV4 = (PD1 \text{ XOR } PD2) \text{ AND } PD2, \qquad \text{[Logic Equation 2]}$$

wherein THV4 is a value of the fourth threshold voltage state, PD1 is the first page data, and PD2 is the second page data.

7. The method of claim 1, wherein the first read voltage or the third read voltage is set as a median value of the section in which the change in the number of memory cells is a lowest value.

8. The method of claim 1, wherein the section in which the change in the number of memory cells corresponding to the first threshold voltage state or the fourth threshold voltage state is a lowest value is searched using a binary search manner.

* * * * *